United States Patent [19]
Kubo

[11] Patent Number: 5,791,915
[45] Date of Patent: Aug. 11, 1998

[54] IC SOCKET

[75] Inventor: Masaaki Kubo, Tokyo, Japan

[73] Assignee: Yamaichi Electronics Co., Ltd., Tokyo, Japan

[21] Appl. No.: 621,311

[22] Filed: Mar. 25, 1996

[30]     Foreign Application Priority Data

Mar. 24, 1995 [JP] Japan ................................ 7-091408

[51] Int. Cl.$^6$ ........................................................... H01R 9/09
[52] U.S. Cl. ................................................ 439/73; 439/331
[58] Field of Search ................................. 439/72, 73, 331

[56]         References Cited

U.S. PATENT DOCUMENTS

| | | | |
|---|---|---|---|
| 4,758,176 | 7/1988 | Abe et al. | 439/72 |
| 4,984,991 | 1/1991 | Nishimoto | 439/72 |
| 5,009,608 | 4/1991 | Shipe | 439/73 |
| 5,199,890 | 4/1993 | Kubo | 439/72 |
| 5,360,348 | 11/1994 | Johnson | 439/72 |

*Primary Examiner*—Neil Abrams
*Assistant Examiner*—Barry Matthew L. Standig
*Attorney, Agent, or Firm*—Wenderoth, Lind & Ponack

[57]              ABSTRACT

An IC socket includes a retaining cover adapted to be closed onto a socket main body, and an IC retaining member when the cover is closed, the IC retaining member presses against an IC which, in turn presses against IC contacts mounted on the socket main body. In addition, the IC socket includes a spring for idly supporting the IC retaining member on the retaining cover via a shaft, and moreover, biasing the IC retaining member in the IC retaining direction. The spring is borne by the shaft, and a part of the reactive force of the contacts arising at the time of retaining the IC with the IC retaining member is absorbed in the spring.

12 Claims, 6 Drawing Sheets

IC SOCKET

BACKGROUND OF THE INVENTION

1. Field of the Invention

The present invention relates to an IC socket which assures that IC holding and contact are obtained by closing a retaining cover onto a socket main body.

2. Description of the Prior Art

As shown in FIG. 10, an IC socket which is constructed such that leads 103 of an IC 102 mounted on a socket main body 101 are placed on contacts 104, the leads 103 are depressed by an IC retaining member 106 disposed on the cover 105, causing the contacts 104 to be deflected by closing the retaining cover 105 onto the socket main body 101, and the contact pressure appearing between the leads 103 and the contacts 104 is obtained by the reactive force derived from the deflecting of the contacts 104 in that way has been hitherto known.

As shown in the drawing, the retaining cover 105 is openably/closeably supported by a shaft 112 at one end of the socket main body 101, while the closed state is maintained by engaging a lock lever 107 with the other end of the socket main body 101.

The IC retaining member 106 is turnably mounted with the retaining cover 105 by a shaft 108 so that a certain intensity of depressing force is applied to each group of leads 103 at possibly the same time.

The aforementioned type of IC socket is disclosed in, e.g., an official gazette of Japanese Patent Publication NO. 3-68513.

In FIG. 10, the IC 102 having the leads 103 projected sideward in the left/right direction is shown. In the case of a leadless type IC having an electrically conductive pad disposed below the IC 102, the IC retaining member 106 depresses the upper surface of the IC main body.

However, the foregoing type of IC socket has a potential problem that when the retaining cover 105 is kept closed, the IC retaining member 106 excessively depresses the leads 103 and the contacts 104, causing a spring portion of each contact 104 to be deformed. In the case that e.g., a shaft supporting portion of the IC retaining cover 105 has a certain amount play, the lead depressing force impounded by the IC retaining member is reduced move than is acceptable, thereby causing a malfunction due to the shortage of contact pressure.

Especially, the problem consists in that warpage of the socket main body is caused on receipt of the reactive force of all the contacts, and this warpage induces incorrect contact.

The reactive force of all the contacts 104 is exerted on the retaining cover 105. Since a number of contacts are implanted in the socket main body 101, and moreover, holes for the contacts are drilled in the socket main body 101, the socket main body 101 has less rigidity than that of the cover 105 so that warpage of the weaker socket main body 1 occurs on receipt of the reactive force.

SUMMARY OF THE INVENTION

The present invention has been made in consideration of the aforementioned background.

Thus, an object of the present invention is to provide an IC mount type IC socket which has solved the foregoing problems.

To accomplish the above object, the present invention provides an IC socket including a retaining cover adapted to close onto a socket main body, and an IC retaining member for pressing against an IC which, in turn, presses against IC contacts mounted on the socket main body. The IC socket includes a spring for idly supporting the IC retaining member on the retaining cover via a shaft, and moreover, biasing the IC retaining member in the IC retaining direction. The spring load is borne by the shaft and a part of the reactive force of the contacts arising at the time of retaining the IC with the IC retaining member is absorbed in the spring.

It is preferable that a leaf spring or a wire spring is used for the spring. The opposite ends of the spring are engaged with the retaining cover, and the IC retaining member is depressed at the central part of the spring on the support shaft so that the spring load is borne by the shaft.

According to the present invention, while the retaining cover is kept closed, the IC is squeezed by the IC retaining member so that the IC contacts are against the contacts. A part of the reactive force of all the contacts arising at this time is absorbed by the IC retaining member being deflected upwardly against the resiliency of the spring, and adequate contact force can be maintained at the position where the restoring force of the spring is balanced with the restoring force of the contacts.

By the foregoing absorption, the problem of warpage of the socket main body can be substantially prevented. In addition, the problem that deformation is caused by excessively deflecting the contacts and thereby, causing deformation to occur can effectively be prevented.

Since the IC retaining member is supported in the shaft supporting portion with play, the spring is displaced within the range defined by the play while deflecting the spring. Thus, a part of the reactive force of all the contacts can be absorbed in the spring.

DESCRIPTION OF THE PREFERRED EMBODIMENTS

The present invention will now be described in detail hereinafter with reference to the accompanying drawings which illustrate preferred embodiments thereof.

As shown in FIG. 1 to FIG. 5, an IC 102 placed on a socket main body I includes leads projected in two directions or four directions relative to the sides of an IC main body. Otherwise, a plurality of electrically conductive pads are arranged on the lower surface of the IC main body. These leads and electrical conductive pads are generally called IC contacts (or IC leads) 3.

A number of contacts 4 each having resiliency are implanted around an IC receiving portion, and IC contacts 3 are placed on contact ends of the contacts 4.

The IC contacts 3 are forcibly thrust against the contact ends of the contacts 4 by closing a retaining cover 5 onto a socket main body 1 to define a closed state, whereby the contacts 4 are deflected against the resiliency and the contact ends of the contacts 4 are brought into pressure contact with the IC contacts 3 by the action of the reactive force.

Figure 1:
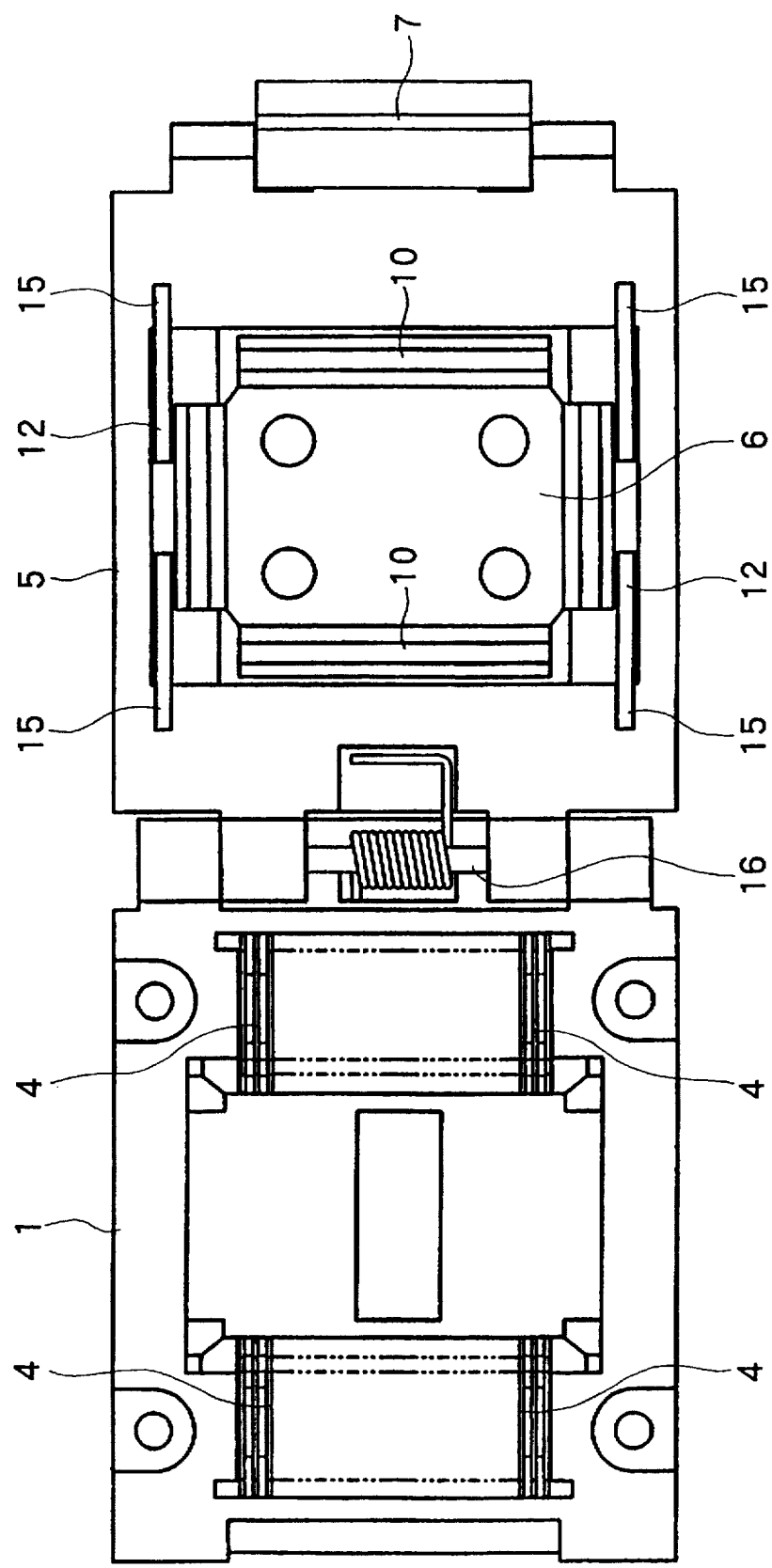
FIG. 1 is a plan view of an IC socket constructed in accordance with an embodiment of the present invention.
Figure 2:
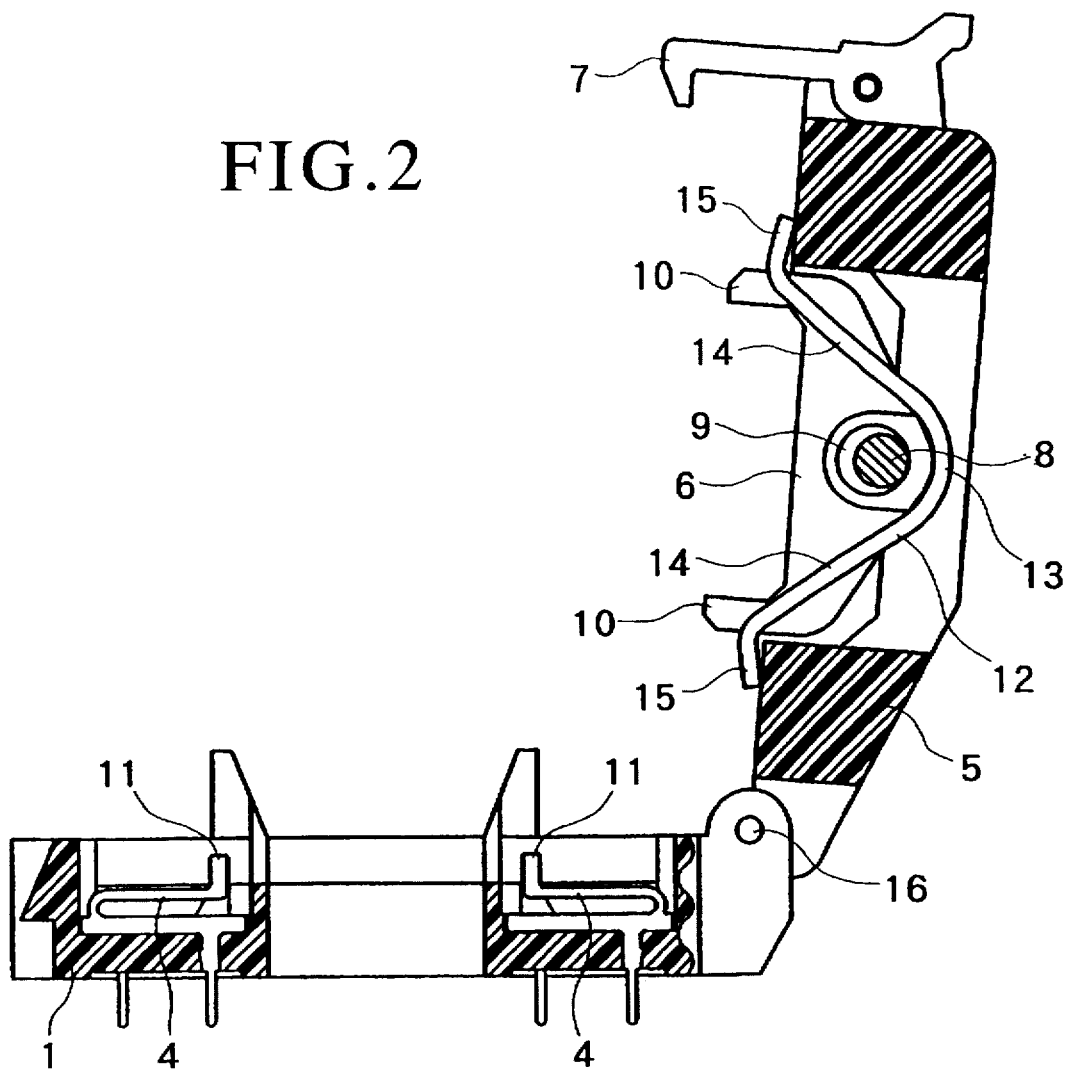
FIG. 2 is a sectional view of the IC socket, showing a retaining cover in an open state.

As shown in FIG. 1 and FIG. 2, the retaining cover 5 is pivotally supported for pivoting about a shaft 16 located at one end of the socket main body 1 so that the retaining cover 5 is held on the socket main body 1 and is movable between the opened and closed states.

An IC retaining member 6 is disposed in the retaining cover 5. The IC retaining member 6 is pivotally supported by a shaft 8 located at a substantially central position and extending in parallel with the shaft 16 in an idly supported state. Specifically, the shaft 8 is rotatably supported in a shaft hole 9 of the retaining covers with play between the shaft 8 and the retaining cover 5, and the IC retaining member 6 is allowed to move relative to the retaining cover 5 within the range defined by the amount of play in the shaft hole 9.

The IC retaining member 6 includes pressing portions 10 which are arranged with the idle supporting portion as a center, and when the retaining cover 5 is placed on the socket main body 101 in the closed state, the pressing portions 10 press against the IC contacts 3 which, in turn, are press against contact ends 11 of contacts 4. This causes the contacts 4 to be deflected against their own resilient force, such that the reactive force brings the contact ends 11 in pressure contact with the IC contacts 3.

At this time, the IC retaining member 6 is resiliently held by a spring 12 to bias the IC retaining member 6 in an IC retaining direction, i.e., in a direction opposite to the direction of the reactive force of the contacts 4. The load of the spring 12 is received by the shaft B.

Figure 4A:
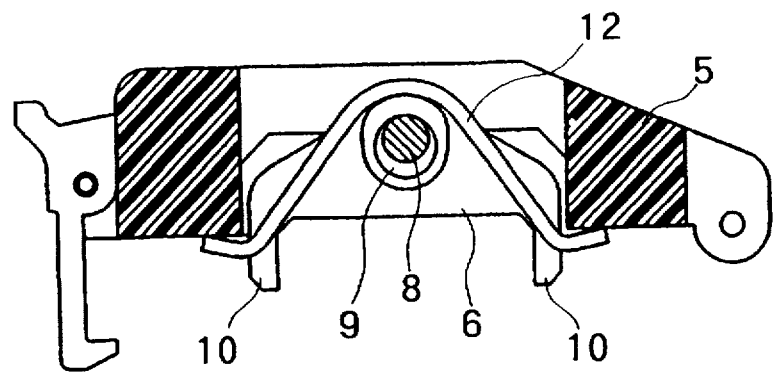
FIG. 4(A) is a vertical sectional view the retaining cover, showing an IC retaining member disposed in the retaining cover and held in an idly supported state.
Figure 4B:
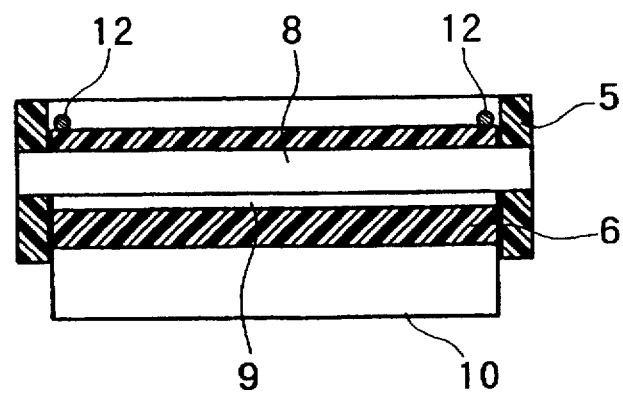
FIG. 4(B) is a cross-sectional view of the IC retaining member shown in FIG. 4(A).

Thus, when the retaining cover 5 is open, the shaft 8 comes in contact with the wall of the shaft hole 9 at the position offset by the resilient force of the spring 12 to support the retaining member 6 as shown in FIG. 2, FIG. 4(A) and FIG. 4(B).

When the retaining cover 5 is held on the socket main body 101 in the closed state, the pressing portions 10 of the IC member 6 press against the IC contacts 3 which in turn come in pressure contact with the IC contacts 3.

As a result, the contacts 4 are deflected against their own resilient force, such that the reactive force causes the contact ends 11 to be pressed against by the IC contacts 11, and at the same time, a part of the reactive force of the contacts 4 is absorbed by the spring 12.

Figure 3:
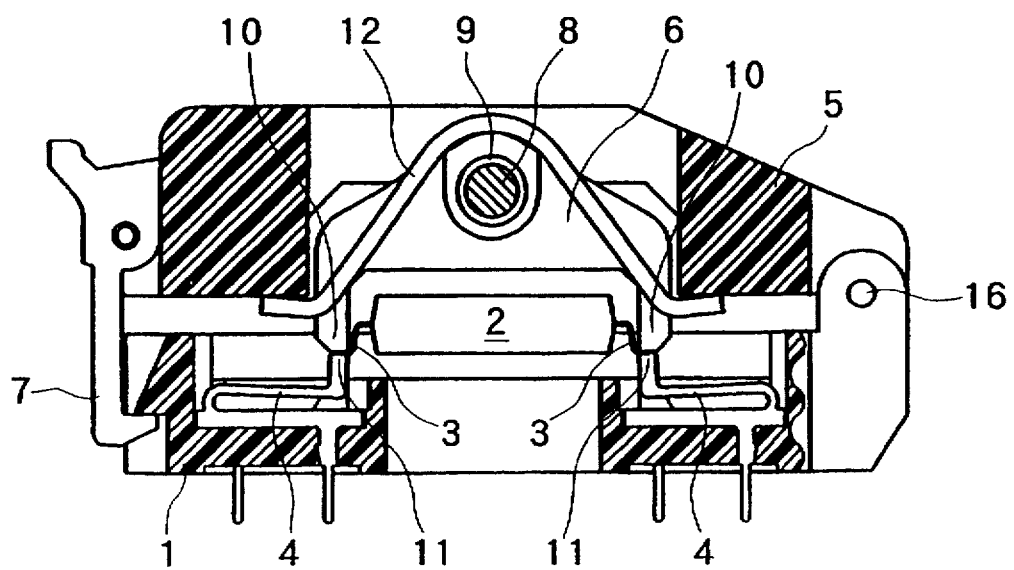
FIG. 3 is a sectional view of the IC socket, showing the retaining cover in a closed state.
Figure 5A:
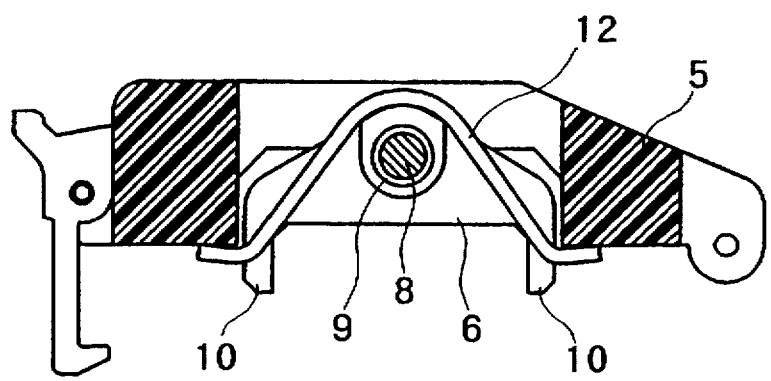
FIG. 5(A) is a vertical sectional view of the IC retaining member shown in FIG. 4(A), showing the retaining cover held in the closed state.
Figure 5B:
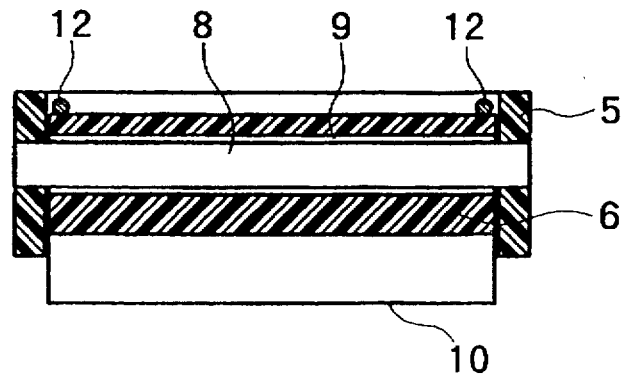
FIG. 5(B) is a cross-sectional view of the IC retaining member shown in FIG. 4(B), showing the retaining cover held in the closed state.

Specifically, as shown in FIG. 3, FIG. 5A and FIG. 5B, the reactive force of the contacts 4 is exerted on the pressing ends 10 of the IC retaining member 6 whereby the IC retaining member 6 is deflected against the resiliency of the spring 12 to absorb a part of the reactive force of the spring 12. At the same time, the IC contacts 3 come in pressure contact with the contact ends 11 at the positions where the reactive force of the contacts 4 is balanced with the reactive force of the spring 12.

When the IC retaining member 6 is raised up by the reactive force of the contacts 4, as shown in FIG. 5A and FIG. 5B, the shaft 8 is displaced from one side of the shaft hole 9 to the other side of the same so that the shaft 8 is held in the a non-contact state relative to the inner wall of the shaft hole 9 or comes in contact with the inner wall of the shaft hole 9 opposite the one side thereof.

As shown in FIG. 1 to FIG. 5, the shaft 8 is idly inserted through the shaft hole 9 located substantially at the center line of the IC retaining member 6, and the opposite ends of the shaft 8 are supported by the retaining cover 5.

As shown in FIG. 4 and FIG. 5, the spring 12 thrusts the IC retaining member 6 at the positions located in the vicinity of the opposite ends of the shaft 8.

Specifically, a pair of springs 12 are provided, and they thrust the IC retaining member 6 at the opposite ends of the shaft hole 9.

Leaf springs or wire springs can be used for the springs 12. The leaf springs or wire springs 12 are arranged perpendicular to a turning movement line of the IC retaining member 6 so that the turning movement line of the IC retaining member 6 is thrust by the central part of the leaf springs or the wire springs 12.

Arm ends 15 of left/right arm portions 14 extending in the leftward/rightward direction from the central retaining portions 13 of the leaf springs or the wire spring portions 12 are engaged with the retaining cover 5.

While the engaged state is maintained, the springs 12 store resilient force by which the turning movement line of the IC retaining member 6 is thrust in the IC retaining direction, and the spring load is borne by the shaft 8.

The reactive force of the contacts 4 is exerted on the opposite ends of the IC retaining member 6, and while the central part of the spring 12 is raised up on the turning movement line at the central part of the retaining member 6, the retaining member 6 is raised up within the range allowed by the shaft hole 9.

As reactive action, the spring 12 depresses the central part of the retaining member 6 at the central pressing portion 13 so that the IC contacts 3 are thrust toward the contact ends of the contacts 4, and at the same time, as the spring 12 deflects by the reactive force of the contacts 4, a part of the reactive force of the contacts 4 is absorbed.

As mentioned above, a number of contacts 4 are arranged on the socket main body 101, and the socket main body 101 has little rigidity compared with the retaining cover 5. When the reactive force of the contact 4 is exerted on IC retaining member 6 and the retaining cover 5 while the foregoing state is maintained, the reactive force of the contacts 4 is exerted on the socket main body 101 as reactive function, causing warpage to occur. In addition, there is a concern that the IC retaining member 6 will press excessively against the contacts 4, causing them to be deformed.

For example, when one end of the retaining cover 5 is pivotally supported at one end of the socket main body 101, the other end of the retaining cover 5 is engaged with the socket main body 101 by a lock lever 7, and the cover 5 is kept closed relative to the socket main body 101, there is a concern that the central part of the socket main body 1 will be warped by the reaction force of the contacts 4.

Also in the case that the retaining cover 5 is disposed separately from the socket main body 101, and the opposite ends of the retaining cover 5 are engaged with the socket main body 101 by lock levers, things are same.

The present invention is intended to improve the problem of warpage of the socket main body as mentioned above as far as possible.

Next, FIG. 6(A), FIG. 6(B), FIG. 7(A) and FIG. 7(B) illustrate another example of a mechanism for idly supporting the IC retaining member 6.

In this embodiment, the shaft 8 composed of a metallic pin is arranged in parallel with the shaft 16, and it extends through the IC retaining member 6 at the central part of the latter, and the shaft 8 is inserted through shaft holes 9 formed in the retaining cover 5 such that play is present between the shaft 8 and the inner walls of the holes 9.

The IC retaining member 6 moves within the range allowed by the play defined by the shaft hole 9 and the shaft 8 to deflect the spring 12.

The spring 12 resiliently thrusts the IC retaining member 6 in the IC retaining direction at the opposite ends on the shaft support line of the IC retaining member 6 in the same manner as mentioned above.

Figure 6A:
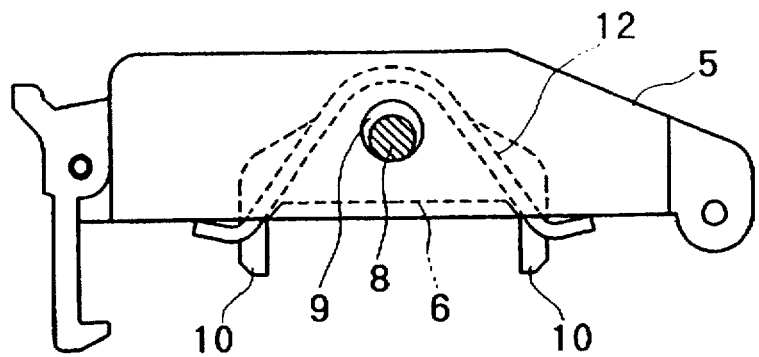
FIG. 6(A) is a side view of a retaining cover, showing and another example of a structure for supporting an IC retaining member in an idly supported state.
Figure 6B:
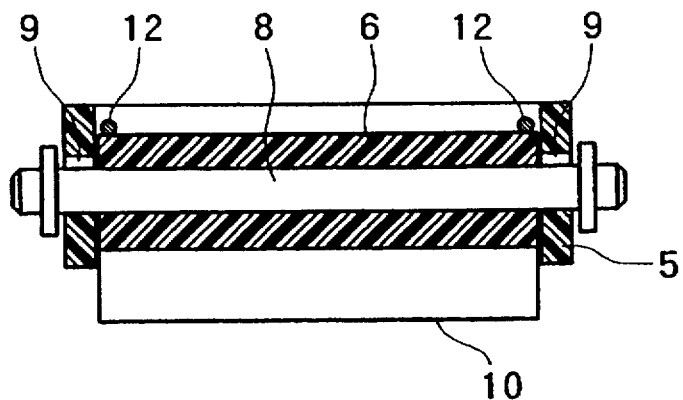
FIG. 6(B) is a cross-sectional view of the IC retaining member shown in FIG. 6(A).
Figure 7A:
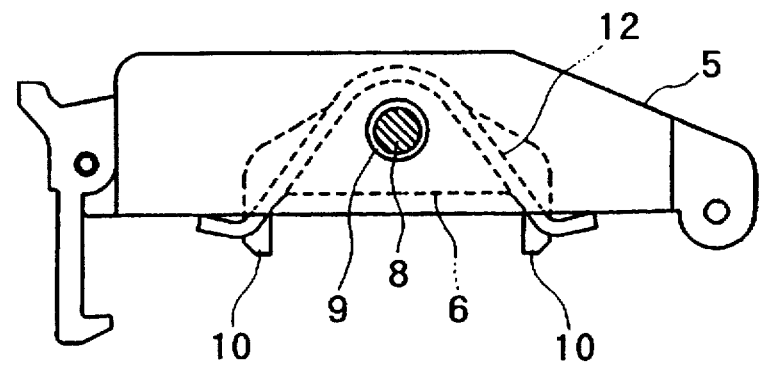
FIG. 7(A) is a side view of a retaining cover, showing the example of the structure for supporting an IC retaining member of FIG. 6(A), but with the retaining member in a closed state.
Figure 7B:
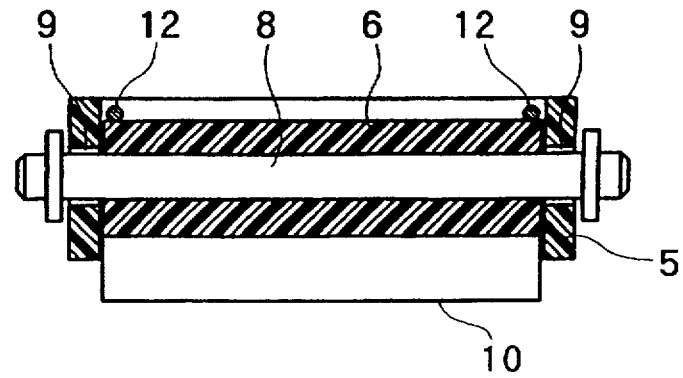
FIG. 7(B) is a cross-sectional view of the IC retaining member shown in FIG. 7(A).

Before the cover 5 is kept closed, as shown in FIG. 6(A), the shaft 8 is thrusted against the lower end of the shaft hole 9 by the thrusting force of the spring 12 to support the IC retaining member 6. As shown in FIG. 7A and 7B, while cover 5 is kept closed, the IC retaining member 9 moves within the range allowed by the shaft hole 9 while deflecting the spring 12 against the resilient force by the reactive force of the contact 4 to thereby absorb a part of the reactive force.

Figure 8A:
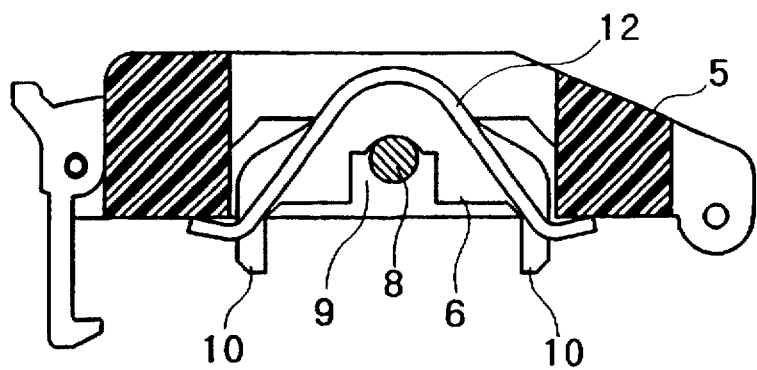
FIG. 8(A) is a side view of a retaining cover, showing a still further example of a structure for supporting an IC retaining member in an idly supported state.
Figure 8B:
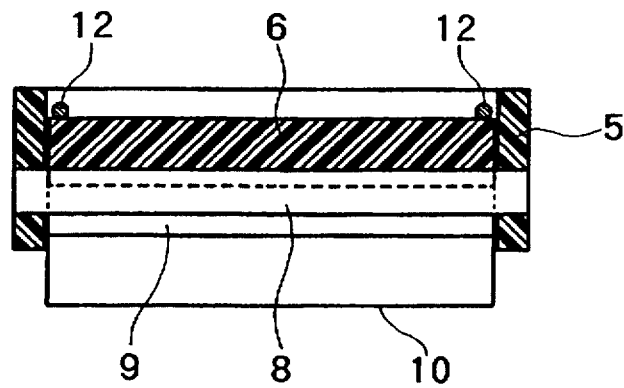
FIG. 8(B) is a cross-sectional view of the IC retaining member shown in FIG. 8(A).

In addition, FIG. 8(A) and FIG. 8(B) show another example of the mechanism for idly supporting the IC retaining member.

In this embodiment, there is shown the case that the mail shaft hole 9 is formed in the shape of a cutout hole while its one side is kept open in the longitudinal direction in the case that the rotational shaft 8 is idly supported in the shaft hole 9 formed on the IC retaining member.

The IC retaining member 6 moves within the range allowed by the play defined by the shaft hole 9 and the shaft 8 to deflect the spring 12.

The spring 12 resiliently thrusts the IC retaining member 6 in the IC retaining direction at the opposite ends on the shaft support line of the IC retaining member 6 in the same manner as mentioned above.

Before the cover 5 is kept closed, as shown in FIG. 6(A), the shaft 8 is thrusted against the lower end of the shaft hole 9 by the thrusting force of the spring 12 to support the IC retaining member 6. As shown in FIG. 7A and 7B, while cover 5 is kept closed, the IC retaining member 9 moves within the range allowed by the shaft hole 9 while deflecting the spring 12 against the resilient force by the reactive force of the contact 4 to thereby absorb a part of the reactive force.

In addition, FIG. 8(A) and FIG. 8(B) show another example of the mechanism for idly supporting the IC retaining member.

In this embodiment, there is shown the case that the mail shaft hole 9 is formed in the shape of a cutout hole while its one side is kept open in the longitudinal direction in the case that the rotational shaft 8 is idly supported in the shaft hole 9 formed on the IC retaining member.

Specifically, a cutout hole located in parallel with the shaft 16 is formed at the central part of the IC retaining member 6, the shaft 8 is inserted through the cutout hole, the shaft 8 is thrust against the bottom wall of the cutout hole by the spring 12, and the IC retaining member 6 is supported by the cover 5.

Figure 9A:
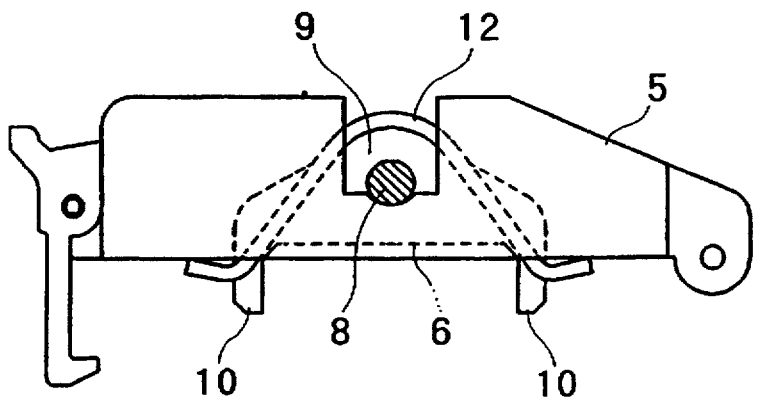
FIG. 9(A) is a side view of a retaining cover, showing yet another example of a structure for supporting an IC retaining member in an idly supported state.
Figure 9B:
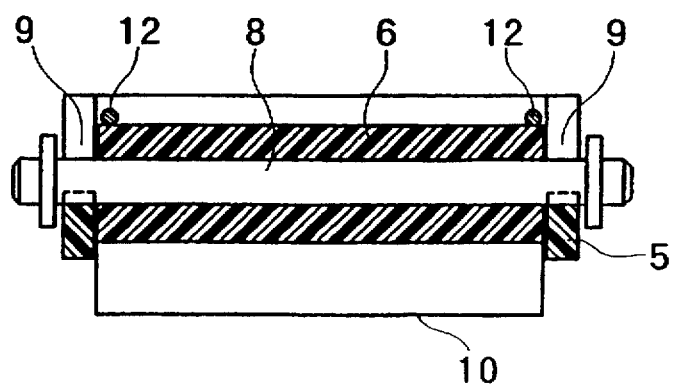
FIG. 9(B) is a cross-sectional view of the IC retaining member shown in FIG. 9 (A).
Figure 10:
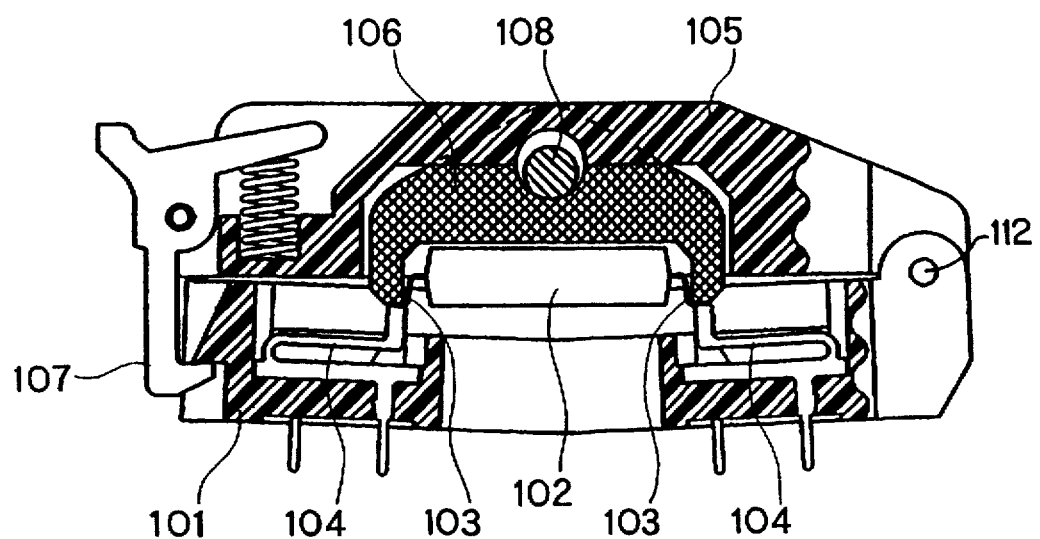
FIG. 10 is a sectional view of a conventional IC socket.

In addition, FIG. 9(A) and FIG. 9(B) shows another example of the mechanism for idly supporting the IC retaining member 6 wherein the opposite ends of the shaft 8 are idly supported in a shaft hole formed in the shape of a cutout on the cover 5.

Specifically, while the shaft 8 is inserted through the central part of the IC retaining member 6, the opposite ends of the shaft 8 are inserted into the shaft holes 9 each formed in the shape of a cutout formed on the cover 5, the shaft 8 is thrust against the bottom wall of the shaft hole 9 by the spring 12, and the IC retaining member 6 is supported by the cover 5.

Each of FIG. 8 and FIG. 9 shows the case th at a shaft hole 9 formed in the shape of a cutout allows the shaft 8 to move, and at the time of movement, the spring 12 is deflected, such that a part of the reactive force of the contacts 4 is absorbed.

According to the present invention, since the IC retaining member disposed on the retaining cover resiliently moves by the reactive force of the contacts and absorbs a part of the reactive force, the problem that the IC retaining member pres ses excessively against the contacts and causes the contacts to be deformed can effectively be prevented. At the same time, the problem that the socket main body is warped by the reactive force of the contacts, resulting in reduced of the contacts can effectively resolved, and moreover the retaining effect attainable from the IC retaining member can sufficiently be exhibited.

While the present invention has been described above with respect to preferred embodiments thereof, it should of course be understood that the present invention should not be limited only to these embodiments. Rather, various modifications may be made without any departure from the scope of the present invention as defined by the appended claims.

What is claimed is:

1. An IC socket for use with an IC having an IC body and IC leads, said IC socket comprising:

a socket main body having an IC receiving portion;

a retaining cover movably mounted relative to said socket main body for movement between a closed position on said socket main body and an open position;

an IC retaining member mounted to said retaining cover and having IC pressing portions;

wherein said IC retaining member is pivotally mounted to said retaining cover, by a pivotal mounting arrangement, for pivotal movement relative to said retaining cover about a pivot axis extending in a first direction;

wherein said pivotal mounting arrangement includes play between said IC retaining member and said retaining cover to allow linear movement of said IC retaining member relative to said retaining cover in opposing second and third directions perpendicular to said first direction; and wherein a spring is operatively interposed between said retaining cover and said IC retaining member and biases said IC retaining member in said second direction toward said socket main body when said retaining cover is in said closed position on said socket main body, but allows movement of said IC retaining member in said third direction against a spring bias of said spring.

2. An IC socket as recited in claim 1, wherein said IC pressing portions comprise two pressing portions at opposing ends of said IC retaining member; and said pivot axis is disposed substantially centrally between said two pressing portions.

3. An IC socket as recited in claim 2, wherein said pivotal mounting arrangement comprises a pivot shaft mounted through holes in said retaining cover and said IC retaining member, respectively.

4. An IC socket as recited in claim 3, wherein said play between said IC retaining member and said retaining cover comprises play between said pivot shaft and said retaining cover.

5. An IC socket as recited in claim 3, wherein said play between said IC retaining member and said retaining cover comprises play between said pivot shaft and said IC retaining member.

6. An IC socket as recited in claim 2, wherein said retaining cover has a first end pivotally mounted to said socket main body and a second end opposite said first end.

7. An IC socket as recited in claim 2, wherein said spring comprises a leaf spring having a center portion pressingly engaged against said IC retaining member, and two opposing ends engaged against said retaining cover.

8. An IC socket as recited in claim 1, wherein said pivotal mounting arrangement comprises a pivot shaft mounted through holes in said retaining cover and said IC retaining member, respectively.

9. An IC socket as recited in claim 8, wherein said play between said IC retaining member and said retaining cover comprises play between said pivot shaft and said retaining cover.

10. An IC socket as recited in claim 8, wherein said play between said IC retaining member and said retaining cover comprises play between said pivot shaft and said IC retaining member.

11. An IC socket as recited in claim 1, wherein said retaining cover has a first end pivotally mounted to said socket main body and a second end opposite said first end.

12. An IC socket as recited in claim 5, wherein said spring comprises a leaf spring having a center portion pressingly engaged against said IC retaining member, and two opposing ends engaged against said retaining cover.

* * * * *